(12) United States Patent
Ibrahim Kani et al.

(10) Patent No.: US 11,576,262 B2
(45) Date of Patent: Feb. 7, 2023

(54) FABRIC-MOUNTED COMPONENTS

(71) Applicant: Apple Inc., Cupertino, CA (US)

(72) Inventors: Bilal Mohamed Ibrahim Kani, Singapore (SG); Benjamin J. Grena, San Francisco, CA (US); Kyusang Kim, Singapore (SG); David M. Kindlon, Felton, CA (US); Pierpaolo Lupo, Singapore (SG); Kishore N. Renjan, Singapore (SG); Manoj Vadeentavida, Singapore (SG)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/212,983

(22) Filed: Mar. 25, 2021

(65) Prior Publication Data

US 2021/0337671 A1    Oct. 28, 2021

Related U.S. Application Data

(60) Provisional application No. 63/015,859, filed on Apr. 27, 2020.

(51) Int. Cl.
*H05K 1/18* (2006.01)
*H05K 1/02* (2006.01)

(52) U.S. Cl.
CPC ........... *H05K 1/186* (2013.01); *H05K 1/0298* (2013.01); *H05K 1/189* (2013.01); *H05K 1/0274* (2013.01);
(Continued)

(58) Field of Classification Search
CPC ...... H05K 1/186; H05K 1/0298; H05K 1/189; H05K 1/0274; H05K 2201/10083;
(Continued)

(56) References Cited

U.S. PATENT DOCUMENTS 9,786,623 B2 * 10/2017 Lin .................... H01L 23/36
10,174,444 B1    1/2019 Podhajny et al.
(Continued)

FOREIGN PATENT DOCUMENTS

CN        1961431 A     5/2007
CN      104170102 A    11/2014
(Continued)

OTHER PUBLICATIONS

Dorfel, "Development of Solutions for Inserting Inserts on Ribbon Loom and Wide-Weaving Machines for Smart Fabrics and Automobile Fabrics", Institute for Textile Machinery and Textiles High Performance Materials Technology at TU [Technical University] Dresden (ITM), Jan. 13, 2011.

*Primary Examiner* — Binh B Tran
(74) *Attorney, Agent, or Firm* — Treyz Law Group, P.C.; Kendall P. Woodruff

(57) ABSTRACT

Fabric may include one or more conductive strands. An insertion tool may insert an electrical component into the fabric during formation of the fabric. The electrical component may include an electrical device mounted to a substrate and encapsulated by a protective structure. An interconnect structure such as a metal via or printed circuit layers may pass through an opening in the protective structure and may be used to couple a conductive strand to a contact pad on the substrate. The protective structure may be transparent or may include an opening so that light can be detected by or emitted from an optical device on the substrate. The protective structure may be formed using a molding tool that provides the protective structure with grooves or may be molded around a hollow conductive structure to create grooves. An electrical component mounted to the fabric may be embedded within printed circuit layers.

20 Claims, 13 Drawing Sheets

(52) U.S. Cl.
CPC .............. *H05K 2201/10083* (2013.01); *H05K 2201/10106* (2013.01); *H05K 2201/10121* (2013.01); *H05K 2201/10151* (2013.01); *H05K 2201/10159* (2013.01)

(58) Field of Classification Search
CPC .......... H05K 2201/10106; H05K 2201/10121; H05K 2201/10151; H05K 2201/10159
USPC ....................................................... 361/761
See application file for complete search history.

(56) References Cited

U.S. PATENT DOCUMENTS

| | | | |
|---|---|---|---|
| 10,485,103 | B1 | 11/2019 | Sunshine et al. |
| 10,566,261 | B2 * | 2/2020 | Pei ..................... H01L 23/3736 |
| 2007/0049147 | A1 | 3/2007 | Hill et al. |
| 2009/0253325 | A1 | 10/2009 | Brookstein et al. |
| 2013/0033879 | A1 | 2/2013 | Vicard et al. |
| 2016/0276307 | A1 | 9/2016 | Lin |
| 2017/0251555 | A1 | 8/2017 | Sunshine et al. |
| 2018/0153033 | A1 | 5/2018 | Sugita et al. |
| 2019/0013274 | A1 | 1/2019 | Sunshine et al. |
| 2020/0283935 | A1 | 9/2020 | Chatham et al. |

FOREIGN PATENT DOCUMENTS

| | | | | |
|---|---|---|---|---|
| CN | 107002318 | A | 8/2017 | |
| DE | 102017100553 | A1 | 7/2018 | |
| TW | 201306211 | A | 2/2013 | |
| WO | WO-2017030851 | A2 * | 2/2017 | ........... A41D 27/205 |
| WO | 2019230730 | A1 | 12/2019 | |

* cited by examiner

FABRIC-MOUNTED COMPONENTS

This application claims the benefit of U.S. provisional patent application No. 63/015,859, filed Apr. 27, 2020, which is hereby incorporated by reference herein in its entirety.

FIELD

This relates generally to items with fabric and, more particularly, to items with fabric and electrical components.

BACKGROUND

It may be desirable to form bags, furniture, clothing, and other items from materials such as fabric. Fabric items generally do not include electrical components. It may be desirable, however, to incorporate electrical components into fabric to provide a user of a fabric item with enhanced functionality.

It can be challenging to incorporate electrical components into fabric. Fabric is flexible, so it can be difficult to mount structures to fabric. Electrical components must be coupled to signal paths (e.g., signal paths that carry data signals, power, etc.), but unless care is taken, signal paths may be damaged, or components may become dislodged as fabric is bent or stretched.

It would therefore be desirable to be able to provide improved techniques for incorporating electrical components into items with fabric.

SUMMARY

Interlacing equipment (e.g., weaving equipment, knitting equipment, braiding equipment, etc.) may be provided with individually adjustable components. The use of individually adjustable components may allow electrical components to be inserted into and/or embedded in the fabric during the creation or formation of the fabric.

The interlacing equipment may create a gap between first and second fabric portions during interlacing operations. The gap may be a void between fabric portions or the gap may be a position or location between fabric portions. An insertion tool may insert an electrical component into the gap, and the electrical component may be electrically coupled to conductive strands in the gap. Interlacing operations may be uninterrupted during the insertion process, if desired. Following insertion and attachment of the electrical component, interlacing operations may continue and the electrical component may be enclosed in the fabric. In some arrangements, the gap between the first and second fabric portions may remain in place after the electrical component is enclosed in the fabric. In other arrangements, the first and second fabric portions may be pulled together such that the gap is eliminated after the electrical component is enclosed in the gap. The fabric may have a bulge where the electrical component is located, or the fabric may not have a bulge where the electrical component is located (e.g., the fabric may have substantially uniform thickness across locations with electrical components and locations without electrical components, if desired).

In an illustrative example, the interlacing equipment may include weaving equipment. Weaving equipment may include warp strand positioning equipment that positions warp strands and weft strand positioning equipment that inserts weft strands among the warp strands to form fabric. The fabric may include insulating strands and conductive strands. The conductive strands may be coupled to electrical components.

An electrical component that is mounted to the fabric may include an electrical device mounted to a substrate and encapsulated by a protective structure. An interconnect structure such as a metal via or printed circuit layers may pass through an opening in the protective structure and may be used to couple a conductive strand to a contact pad on the substrate. The protective structure may be transparent or may include an opening so that light can be detected by or emitted from an optical device on the substrate. The protective structure may be formed using a molding tool that provides the protective structure with grooves or may be molded around a hollow conductive structure to create grooves. An electrical component mounted to the fabric may be embedded within printed circuit layers.

DETAILED DESCRIPTION

Electronic devices, enclosures, and other items may be formed from fabric such as woven fabric. The woven fabric may include strands of insulating and conductive material. Conductive strands may form signal paths through the fabric and may be coupled to electrical components such as light-emitting diodes and other light-emitting devices, integrated circuits, sensors, haptic output devices, and other circuitry.

Interlacing equipment (sometimes referred to as intertwining equipment) may include weaving equipment, knitting equipment, braiding equipment, or any other suitable equipment used for crossing, looping, overlapping, or otherwise coupling strands of material together to form a network of strands (e.g., fabric). Interlacing equipment may be provided with individually adjustable components such as warp strand positioning equipment (e.g., heddles or other warp strand positioning equipment), weft strand positioning equipment, a reed, take-down equipment, let off equipment (e.g., devices for individually dispensing and tensioning warp strands), needle beds, feeders, guide bars, strand processing and component insertion equipment, and other components for forming fabric items. The individual adjustability of these components may allow interlacing operations (e.g., weaving operations, knitting operations, braiding operations, and/or other interlacing operations) to be performed without requiring continuous lock-step synchronization of each of these devices, thereby allowing fabric with desired properties to be woven. As an example, normal reed movement and other weaving operations may be periodically suspended and/or may periodically be out-of-sync with other components to accommodate component insertion operations whereby electrical components (sometimes referred to as nodes or smart nodes) are inserted into the fabric during the creation or formation of the fabric.

Figure 1:
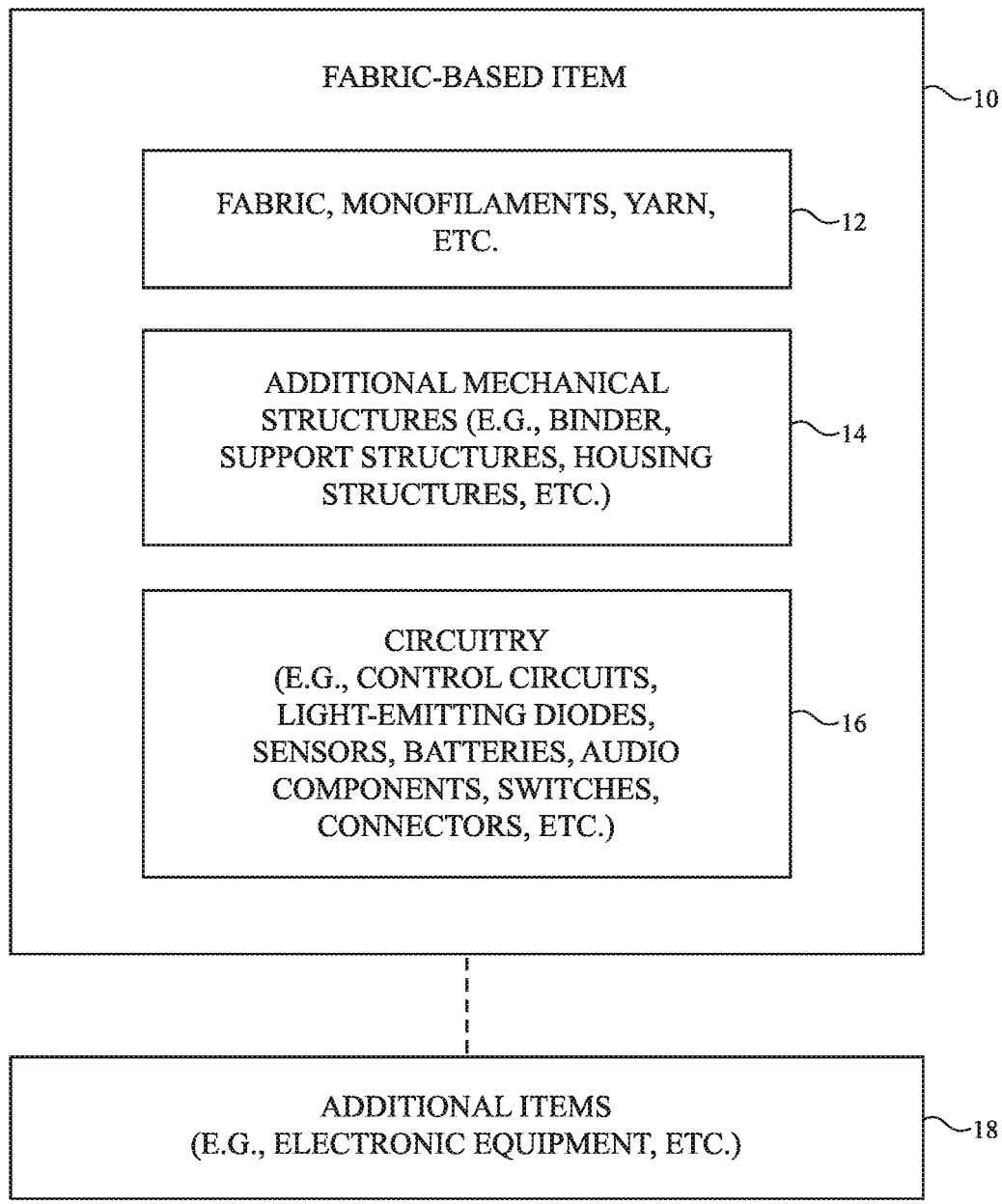
FIG. 1 is a schematic diagram of an illustrative fabric item in accordance with an embodiment.

Items such as item 10 of FIG. 1 may include fabric and may sometimes be referred to as a fabric item or fabric-based item. Item 10 may be an electronic device or an accessory for an electronic device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which fabric item 10 is mounted in a kiosk, in an automobile, airplane, or other vehicle (e.g., an autonomous or non-autonomous vehicle), other electronic equipment, or equipment that implements the functionality of two or more of these devices. If desired, item 10 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, etc.), or may be any other suitable item that incorporates fabric.

Item 10 may include interlaced strands of material such as monofilaments and yarns that form fabric 12. As used herein, "interlaced" strands of material and "intertwined" strands of material may both refer to strands of material that are crossed with one another, looped with one another, overlapping one another, or otherwise coupled together (e.g., as part of a network of strands that make up a fabric). Fabric 12 may form all or part of a housing wall or other layer in an electronic device, may form internal structures in an electronic device, or may form other fabric-based structures. Item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials.

The strands of material used in forming fabric 12 may be single-filament strands (sometimes referred to as fibers) or may be threads, yarns, or other strands that have been formed by interlacing multiple filaments of material together. Strands may be formed from polymer, metal, glass, graphite, ceramic, natural materials such as cotton or bamboo, or other organic and/or inorganic materials and combinations of these materials. Conductive coatings such as metal coatings may be formed on non-conductive strands (e.g., plastic cores) to make them conductive. Reflective coatings such as metal coatings may be applied to strands to make them reflective. Strands may also be formed from single-filament metal wire (e.g., bare metal wire), multifilament wire, or combinations of different materials. Strands may be insulating or conductive.

Strands in fabric 12 may be conductive along their entire lengths or may have conductive portions. Strands may have metal portions that are selectively exposed by locally removing insulation (e.g., to form connections with other conductive strand portions and/or to form connections with electrical components). Strands may also be formed by selectively adding a conductive layer to a portion of a non-conductive strand). Threads and other multifilament yarns that have been formed from interlaced filaments may contain mixtures of conductive strands and insulating strands (e.g., metal strands or metal coated strands with or without exterior insulating layers may be used in combination with solid plastic strands or natural strands that are insulating). In some arrangements, which may sometimes be described herein as an example, fabric 12 may be a woven fabric and the strands that make up fabric 12 may include warp strands and weft strands.

Conductive strands and insulating strands may be woven, knit, or otherwise interlaced to form conductive paths. The conductive paths may be used in forming signal paths (e.g., signal buses, power lines for carrying power, etc.), may be used in forming part of a capacitive touch sensor electrode, a resistive touch sensor electrode, or other input-output device, or may be used in forming other patterned conductive structures. Conductive structures in fabric 12 may be used in carrying electrical current such as power, digital signals, analog signals, sensor signals, control signals, data, input signals, output signals, or other suitable electrical signals.

Item 10 may include additional mechanical structures 14 such as polymer binder to hold strands in fabric 12 together, support structures such as frame members, housing structures (e.g., an electronic device housing), and other mechanical structures.

To enhance mechanical robustness and electrical conductivity at strand-to-strand connections and/or strand-to-component connections, additional structures and materials (e.g., solder, crimped metal connections, welds, conductive adhesive such as anisotropic conductive film and other conductive adhesive, non-conductive adhesive, fasteners, etc.) may be used in fabric 12. Strand-to-strand connections may be formed where strands cross each other perpendicularly or at other strand intersections where connections are desired. Insulating material can be interposed between intersecting conductive yarns at locations in which it is not desired to form a strand-to-strand connection. The insulating material may be plastic or other dielectric, may include an insulating strand or a conductive strand with an insulating coating or insulated conductive monofilaments, etc. Solder connections may be formed between conductive strands and/or between conductive strands and electrical components by melting solder so that the solder flows over conductive strands. The solder may be melted using an inductive soldering head to heat the solder, using hot air to heat the solder, using a reflow oven to heat the solder, using a laser or hot bar to heat the solder, or using other soldering equipment. In some arrangements, outer dielectric coating layers (e.g., outer polymer layers) may be melted away in the presence of molten solder, thereby allowing underlying metal yarns to be soldered together. In other arrangements, outer dielectric coating layers may be removed prior to soldering (e.g., using laser ablation equipment or other coating removal equipment).

Circuitry 16 may be included in item 10. Circuitry 16 may include electrical components that are coupled to fabric 12, electrical components that are housed within an enclosure formed by fabric 12, electrical components that are attached to fabric 12 using welds, solder joints, adhesive bonds (e.g., conductive adhesive bonds such as anisotropic conductive adhesive bonds or other conductive adhesive bonds), crimped connections, or other electrical and/or mechanical bonds. Circuitry 16 may include metal structures for carrying current, electrical components such as integrated circuits, light-emitting diodes, sensors, and other electrical devices. Control circuitry in circuitry 16 may be used to control the operation of item 10 and/or to support communications with item 18 and/or other devices.

Item 10 may interact with electronic equipment or other additional items 18. Items 18 may be attached to item 10 or item 10 and item 18 may be separate items that are configured to operate with each other (e.g., when one item is a case and the other is a device that fits within the case, etc.). Circuitry 16 may include antennas and other structures for supporting wireless communications with item 18. Item 18 may also interact with item 10 using a wired communications link or other connection that allows information to be exchanged.

In some situations, item 18 may be an electronic device such as a cellular telephone, computer, or other portable electronic device and item 10 may form a cover, case, bag, or other structure that receives the electronic device in a pocket, an interior cavity, or other portion of item 10. In other situations, item 18 may be a wrist-watch device or other electronic device and item 10 may be a strap or other fabric item that is attached to item 18 (e.g., item 10 and item 18 may together form a fabric-based item such as a wrist-watch with a strap). In still other situations, item 10 may be an electronic device, fabric 12 may be used in forming the electronic device, and additional items 18 may include accessories or other devices that interact with item 10. Signal paths formed from conductive yarns and monofilaments may be used to route signals in item 10 and/or item(s) 18.

The fabric that makes up item 10 may be formed from yarns and/or monofilaments that are interlaced using any suitable interlacing equipment. With one suitable arrangement, which may sometimes be described herein as an example, fabric 12 may be woven fabric formed using a weaving machine. In this type of illustrative configuration, fabric may have a plain weave, a basket weave, a satin weave, a twill weave, or variations of these weaves, may be a three-dimensional woven fabric, or may be other suitable fabric. This is, however, merely illustrative. If desired, fabric 12 may include knit fabric, warp knit fabric, weft knit fabric, braided fabric, other suitable type of fabric, and/or a combination of any two or more of these types of fabric.

Figure 2:
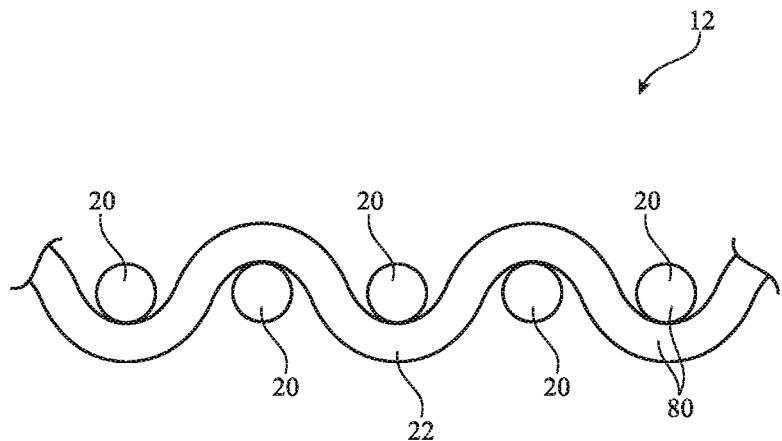
FIG. 2 is a side view of illustrative fabric in accordance with an embodiment.

A cross-sectional side view of illustrative woven fabric 12 is shown in FIG. 2. As shown in FIG. 2, fabric 12 may include strands 80. Strands 80 may include warp strands 20 and weft strands 22. If desired, additional strands that are neither warp nor weft strands may be incorporated into fabric 12. The example of FIG. 2 is merely illustrative. In the illustrative configuration of FIG. 2, fabric 12 has a single layer of woven strands 80. Multi-layer fabric constructions may be used for fabric 12 if desired.

Figure 3:
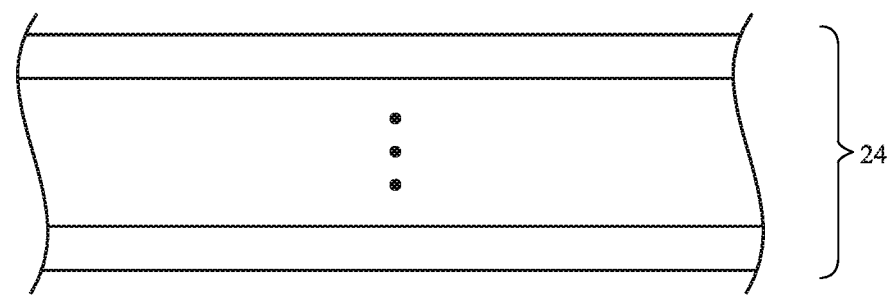
FIG. 3 is a side view of layers of material that may be incorporated into a fabric item in accordance with an embodiment.

Item 10 may include non-fabric materials (e.g., structures formed from plastic, metal, glass, ceramic, crystalline materials such as sapphire, etc.). These materials may be formed using molding operations, extrusion, machining, laser processing, and other fabrication techniques. In some configurations, some or all of item 10 may include one or more layers of material such as layers 24 of FIG. 3. Layers 24 may include layers of polymer, metal, glass, fabric, adhesive, crystalline materials, ceramic, substrates on which components have been mounted, patterned layers of material, layers of material containing patterned metal traces, thin-film devices such as transistors, and/or other layers.

Figure 4:
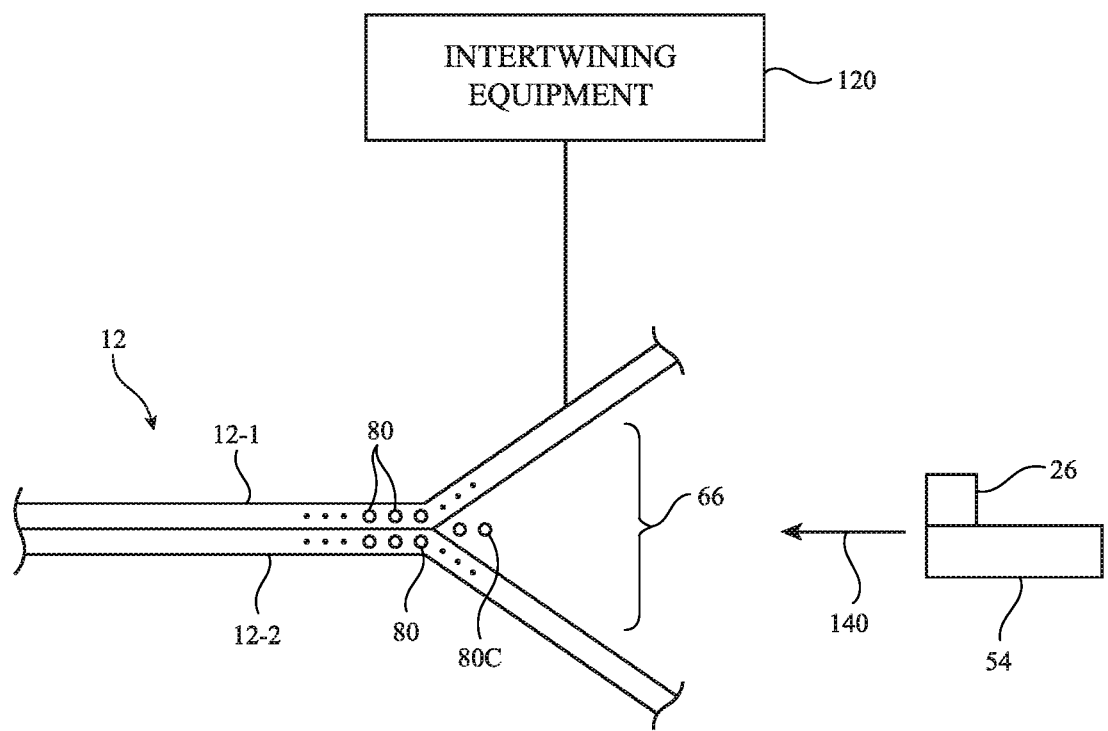
FIG. 4 is a diagram illustrating how interlacing equipment may be used to create fabric while an insertion tool is used to insert one or more electrical components into the fabric in accordance with an embodiment.

A diagram illustrating how electrical components may be inserted into fabric 12 during the formation of fabric 12 is illustrated in FIG. 4. As shown in FIG. 4, fabric 12 may be formed from fabric portions such as fabric portions 12-1 and 12-2. Fabric portions 12-1 and 12-2 may be formed from interlaced strands 80. For example, a first set of strands 80 may be used to form fabric portion 12-1 and a second set of strands 80 may be used to form fabric portion 12-2. Fabric portions 12-1 and 12-2 may be different portions of a single layer of fabric 12, or fabric portion 12-1 may form one or more first layers of fabric 12 and fabric portion 12-2 may form one or more second layers of fabric 12.

Using interlacing equipment 120, strands 80 may be interlaced to form fabric 12. Interlacing equipment 120 may be weaving equipment, knitting equipment, braiding equipment, or other suitable interlacing equipment. Interlacing equipment 120 may be used to create one or more regions in fabric 12 such as pocket 66 (sometimes referred to as a gap, space, cavity, void, position, location, etc.) for receiving electrical components. Regions in fabric 12 that receive electrical components such as pocket 66 may be formed by creating a space or gap between portions of fabric 12 such as fabric portion 12-1 and fabric portion 12-2. The term "pocket" may be used to refer to a void between fabric portions and/or may be used to refer to a position or location between fabric portions (e.g., a position between strands of material in fabric 12, with or without an actual void).

Electrical components may be inserted into pocket 66 during the formation of fabric 12 using component insertion equipment such as insertion tool 54. Insertion tool 54 may hold component 26 and may position component 26 in pocket 66 during interlacing operations (e.g., by moving component 26 towards pocket 66 in direction 140). If desired, component 26 may be electrically and/or mechanically connected to one or more conductive strands 80C in pocket 66. Following insertion and attachment of component 26, interlacing equipment 120 may continue interlacing operations (which may include closing pocket 66, if desired) to continue forming fabric 12.

In some arrangements, processing steps such as alignment of component 26 with conductive strands 80C, electrically connecting (e.g., soldering) component 26 to conductive strands 80C, encapsulation of the electrical connection between component 26 and conductive strands 80C, and/or verification of the integrity of the electrical connection between component 26 and conductive strands 80C may be performed after component 26 is inserted into pocket 66.

In some arrangements, the gap between first and second fabric portions 12-1 and 12-2 may remain in place after electrical component 26 is enclosed in fabric 12 (e.g., a space may exist between fabric portions 12-1 and 12-2 after formation of fabric 12 is complete). In other arrangements, first and second fabric portions 12-1 and 12-2 may be pulled together such that gap 66 is eliminated after electrical component 26 is enclosed in the gap (e.g., fabric portions 12-1 and 12-2 may be in contact with one another without an intervening gap after the formation of fabric 12 is complete). Fabric 12 may have a bulge where electrical component 26 is located, or fabric 12 may not have a bulge where electrical component 26 is located (e.g., the fabric may have substantially uniform thickness across locations with electrical components 26 and locations without electrical components 26, if desired).

Figure 5:
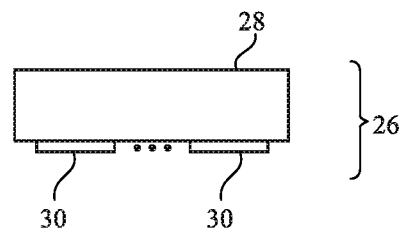
FIG. 5 is a cross-sectional side view of an illustrative electrical component in accordance with an embodiment.

A side view of an illustrative electrical component of the type that may be used in item 10 is shown in FIG. 5. Electrical components in item 10 such as illustrative electrical component 26 of FIG. 5 may include discrete electrical components such as resistors, capacitors, and inductors, may include connectors, may include batteries, may include input-output devices such as switches, buttons, light-emitting components such as light-emitting diodes, audio components such as microphones and speakers, vibrators (e.g., piezoelectric actuators that can vibrate), solenoids, electromechanical actuators, motors, and other electromechanical devices, microelectromechanical systems (MEMs) devices, pressure sensors, light detectors, proximity sensors (light-based proximity sensors, capacitive proximity sensors, etc.), force sensors (e.g., piezoelectric force sensors), strain gauges, moisture sensors, temperature sensors, accelerometers, gyroscopes, compasses, magnetic sensors (e.g., Hall effect sensors and magnetoresistance sensors such as giant magnetoresistance sensors), touch sensors, and other sensors, components that form displays, touch sensor arrays (e.g., arrays of capacitive touch sensor electrodes to form a touch sensor that detects touch events in two dimensions), and other input-output devices, energy storage devices, electrical components that form control circuitry such as non-volatile and volatile memory, microprocessors, application-specific integrated circuits, system-on-chip devices, baseband processors, wired and wireless communications circuitry, and other integrated circuits.

Electrical components such as component 26 may be bare semiconductor dies (e.g., laser dies, light-emitting diode dies, integrated circuits, etc.) or packaged components (e.g. semiconductor dies or other devices packaged within plastic packages, ceramic packages, or other packaging structures). One or more electrical terminals such as contact pads 30 may be formed on body 28 of component 26. Body 28 (sometimes referred to as device 28, electrical device 28, etc.) may be a semiconductor die (e.g., a laser die, light-emitting diode die, integrated circuit, etc.) or may be a package for a component (e.g., a plastic package or other dielectric package that contains one or more semiconductor dies or other electrical devices). Contacts for body 28 such as pads 30 may be protruding leads, may be planar contacts, may be formed in an array, may be formed on any suitable surfaces of body 28, or may be any other suitable contacts for forming electrical connections to component 26. For example, pads 30 may be metal solder pads.

Figure 6:
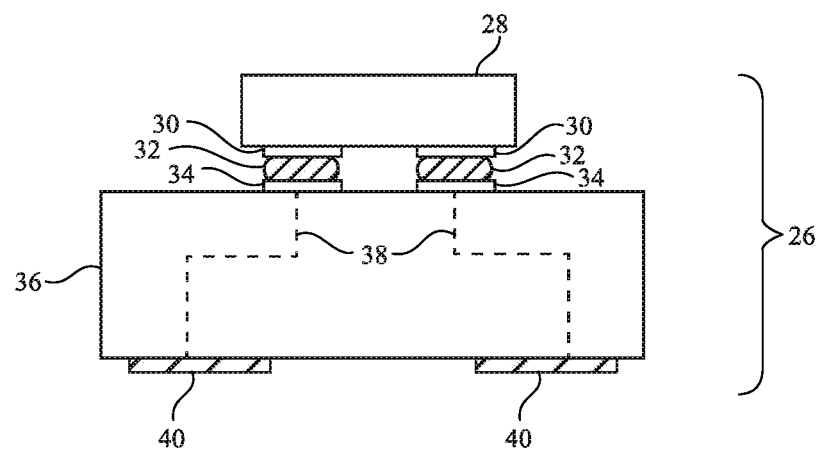
FIG. 6 is a cross-sectional side view of an illustrative electrical component having an electrical device mounted on an interconnect substrate in accordance with an embodiment.

As shown in the example of FIG. 6, body 28 may be mounted on a support structure such as substrate 36. Interposer 36 (sometimes referred to as an interconnect substrate, a printed circuit substrate, etc.) may be a printed circuit, ceramic carrier, or other substrate. The layer(s) forming interconnect substrate 36 may include one or more flexible printed circuit layers such as polyimide layers, one or more layers of rigid printed circuit board material such as fiberglass-filled epoxy (e.g., FR4), and/or layers of other materials (e.g., other dielectric materials such as silicone, other elastomeric material, other flexible polymers, etc.). Interconnect substrate 36 may be larger than body 28 or may have other suitable sizes. Interconnect substrate 36 may have a planar shape with a thickness of 700 microns, more than 500 microns, less than 500 microns, or other suitable thickness. The thickness of body 28 may be 500 microns, more than 300 microns, less than 1000 microns, or other suitable thickness. The footprint (area viewed from above) of body 28 and substrate 36 may be 10 microns×10 microns, 100 microns×100 microns, more than 1 mm×1 mm, less than 10 mm×10 mm, may be rectangular, may be square, may have L-shapes, or may have other suitable shapes and sizes.

Interconnect substrate 36 may contain signal paths such as metal traces 38. Metal traces 38 (sometimes referred to as interconnects, signal paths, etc.) may have portions forming contacts such as pads 34 and 40. Pads 34 and 40 may be formed on the upper surface of interconnect substrate 36, on the lower surface of interconnect substrate 36, and/or on the sides of interconnect substrate 36. Conductive material such as conductive material 32 may be used in mounting body 28 to interconnect substrate 36. Conductive material 32 may be solder (e.g., low temperature solder, high temperature solder, etc.), may be conductive adhesive (isotropic conductive adhesive or anisotropic conductive film), may be formed during welding, and/or may be other conductive material for coupling electrical device pads (body pads) such as pads 30 on body 28 to interconnect substrate pads 34. Metal traces 38 in substrate 36 may couple pads 34 to other pads such as pads 40. If desired, pads 40 may be larger and/or more widely spaced than pads 34, thereby facilitating attachment of substrate 36 to conductive yarns and/or other conductive paths in item 10. Solder, conductive adhesive, or other conductive connections may be used in coupling pads 40 to conductive strands, printed circuit traces, or other conductive path materials in item 10.

Figure 7:
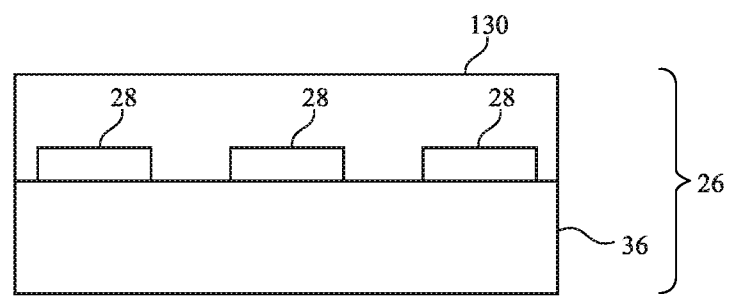
FIG. 7 is a cross-sectional side view of an illustrative electrical component having a protective structure in accordance with an embodiment.

FIG. 7 shows an example in which component 26 includes a protective structure such as protective structure 130 on interconnect substrate 36. Protective structure 130 may, for example, be a plastic structure that completely or partially encapsulates devices 28 and interconnect substrate 36 to provide mechanical robustness, protection from moisture and other environmental contaminants, heat sinking, and/or electrical insulation. Protective structure 130 may be formed from molded plastic (e.g., injection-molded plastic, insert molded plastic, transfer molded plastic, low-pressure molded plastic, two-part molded plastic, etc.) that has been molded over one or more devices 28 and substrate 36 or that is molded into the desired shape and subsequently attached to substrate 36, may be a layer of encapsulant material (e.g., thermoplastic) that has been melted to encapsulate devices 28, may be a layer of polymer such as polyimide that has been cut or machined into the desired shape and subsequently attached to substrate 36, or may be formed using other suitable methods. Illustrative materials that may be used to form protective structure 130 include epoxy, polyamide, polyurethane, silicone, thermoplastic, other suitable materials, or a combination of any two or more of these materials. Protective structure 130 may be formed on one or both sides of substrate 36 (e.g., may completely or partially surround substrate 36).

Protective structure 130 may be entirely opaque, may be entirely transparent, or may have both opaque and transparent regions. Transparent portions of protective structure 130 may allow light emitted from one or more devices 28 to be transmitted through protective structure 130 and/or may allow external light to reach (and be detected by) one or more devices 28. If desired, one or more openings, recesses, grooves, and/or other features may be formed in protective structure 130. For example, an opening may be formed in protective structure 130 to allow light to be detected by and/or emitted from one or more devices 28. Protective structure 130 may include one or more grooves for receiving strands (e.g., conductive or insulating strands) in fabric 12.

Protective structure 130 may, if desired, have different thicknesses. The example of FIG. 7 in which protective structure 130 has uniform thickness across substrate 36 is merely illustrative. In some arrangements, protective structure 130 may be an encapsulant material such as thermoplastic that has been melted to create a robust connection between component 26 and strands 80 of fabric 12. For example, protective structure 130 may surround portions of strands 80, may fill recesses, grooves, or other features in component 26 to help interlock component 26 to strands 80, and/or may fill gaps in fabric 12. Protective structure 130 may include one or more different types of materials, if desired (e.g., one or more different thermoplastic materials with different melting temperatures).

If desired, substrate 36 may be sufficiently large to accommodate multiple electrical devices each with a respective body 28. For example, one or more light-emitting diodes, sensors, microprocessors, and/or other electrical devices may be mounted to a common substrate such as substrate 36 of FIG. 7. The light-emitting diodes may be micro-light-emitting diodes (e.g., light-emitting diode semiconductor dies having footprints of about 10 microns×10 microns, more than 5 microns×5 microns, less than 100 microns×100 microns, or other suitable sizes). The light-emitting diodes may include light-emitting diodes of different colors (e.g., red, green, blue, white, etc.), infrared light, or ultraviolet light. Redundant light-emitting diodes or other redundant circuitry may be included on substrate 36. In configurations of the type shown in FIG. 7 in which multiple electrical devices (each with a respective body 28) are mounted on a common substrate, electrical component 26 may include any suitable combination of electrical devices (e.g., light-emitting diodes, sensors, integrated circuits, actuators, energy storage devices, and/or other devices of the type described in connection with electrical component 26 of FIG. 5).

The examples of FIGS. 6 and 7 in which devices 28 are only located on one side of substrate 36 are merely illustrative. If desired, devices 28 may be mounted to both sides of substrate 36.

Electrical components 26 may be coupled to fabric structures, individual strands, printed circuits (e.g., rigid printed circuits formed from fiberglass-filled epoxy or other rigid printed circuit board material or flexible printed circuits formed from polyimide substrate layers or other sheets of flexible polymer materials), metal or plastic parts with signal traces, or other structures in item 10.

Figure 8:
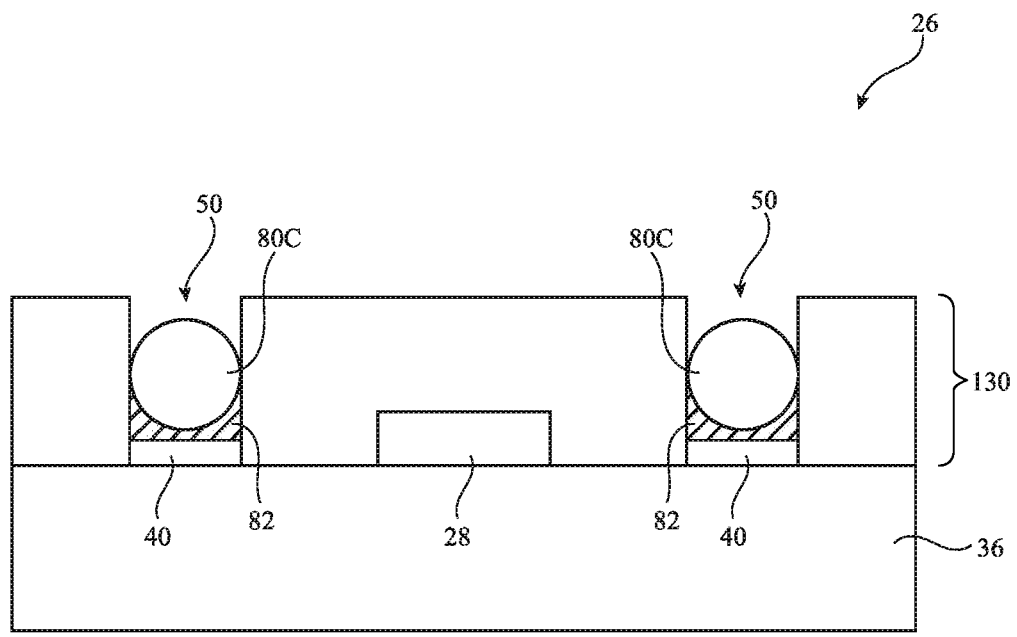
FIG. 8 is a cross-sectional side view of an illustrative electrical component having recesses for receiving strands in accordance with an embodiment.

In some configurations, item 10 may include electrical connections between components 26 and conductive paths in fabric 12. As shown in FIG. 8, for example, component 26 may be coupled to conductive strands 80C of fabric 12. Conductive strands 80C (sometimes referred to as "wires") may be configured to carry electrical signals (e.g., power, digital signals, analog signals, sensor signals, control signals, data signals, input signals, output signals, or other suitable electrical current) to and/or from components 26. Strands 80C may be warp strands (e.g., warp strands 20 of FIG. 2), weft strands (e.g., weft strands 22 of FIG. 2), or other suitable strands 80 in fabric 12. If desired, component 26 may be coupled to only a single conductive strand 80C, may be coupled to two conductive strands 80C, or may be coupled to three or more conductive strands 80C. If desired, component 26 may also or instead be coupled to insulating strands in fabric 12. Arrangements in which component 26 is coupled to a pair of conductive strands 80C are sometimes described herein as an illustrative example.

Component 26 may have contact pads such as pads 40. Conductive material 82 may be used to couple pads 40 to conductive strands 80C. Conductive material 82 may be solder, anisotropic conductive adhesive, or other conductive material. Arrangements in which conductive material 82 is formed from solder may sometimes be described herein as an illustrative example. In the example of FIG. 8, pads 40 are formed on the same surface of substrate 36 on which device 28 is mounted. Conductive material 82 may be used to electrically and mechanically couple component 26 to strands 80C of fabric 12. If desired, pads 40 may also or instead be additionally formed on the lower surface of substrate 36 (e.g., the surface opposite the surface on which device 28 is mounted). The example of FIG. 8 is merely illustrative.

In some configurations, it may be desirable to provide a more robust mechanical connection between component 26 and fabric 12 to ensure that component 26 does not come loose when fabric 12 is bent or stretched. To increase the robustness of the connection between strands 80C and component 26, component 26 may have one or more recesses for receiving strands 80C. For example, one or more strands 80 may be threaded through a portion of component 26 to help secure component 26 to fabric 12. Strands 80 may be threaded through openings (sometimes referred to as recesses, trenches, grooves, holes, slots, notches, etc.) of component 26. The openings may be formed in device 28, interconnect substrate 36, protective structure 130, and/or other portions of component 26. FIG. 8 shows an example in which conductive strands 80C are received within grooves such as grooves 50 that are formed in protective structure 130. This is, however, merely illustrative. If desired, grooves 50 may instead or additionally be formed in interconnect substrate 36, device 28, and/or other portions of component 26. The location, shape, and geometry of grooves 50 of FIG. 8 are merely illustrative.

Grooves 50 (sometimes referred to as recesses, trenches, openings, holes, slots, notches, etc.) in protective structure 130 may be formed by removing portions of protective structure 130 (e.g., using a laser, a mechanical saw, a mechanical mill, or other equipment) or may be formed by molding (e.g., injection molding, insert molding, etc.) or otherwise forming protective structure 130 into a shape that includes grooves 50. Grooves 50 may have a width between 2 mm and 6 mm, between 0.3 mm and 1.5 mm, between 1 mm and 5 mm, between 3 mm and 8 mm, greater than 3 mm, less than 3 mm, or other suitable width. If desired, grooves 50 may have different depths (e.g., to expose contact pads 40 that are located at different surface heights of interconnect substrate 36).

In the example of FIG. 8, grooves 50 expose conductive pads 40 on interconnect substrate 36. Strands 80C may each be threaded through an associated one of grooves 50 in protective structure 130. Solder or other conductive material 82 may be used to electrically and mechanically couple strands 80C to conductive pads 40 in grooves 50 of protective cover 130. Because strands 80C are wedged between portions of protective cover 130, strands 80C may be resistant to becoming dislodged from substrate 36. In addition to holding strands 80C in place so that component 26 remains attached to fabric 12, grooves 50 may also be used as a physical guide for aligning component 26 relative to fabric 12 during component insertion and attachment operations. This may be beneficial when inserting and attaching component 26 to fabric 12 without line of sight, for example.

Each strand 80C may align with an associated pad 40 on component 26. If desired, pads 40 may formed from elongated strips of conductive material (e.g., metal) that extend from one edge of substrate 36 to an opposing edge of substrate 36. This provides a large area with which to form a mechanical and electrical connection between substrate 36 and strands 80C. The elongated shape of pads 40 may allow conductive material 82 to attach a longer portion of strand 80C to pad 40. The connection between pad 40 and strand 80C may, for example, span across the width of substrate 36, thereby providing a robust connection between substrate 36 and strand 80C. This is, however, merely illustrative. If desired, pads 40, conductive material 82, and the exposed conductive portions of strands 80C may span across less than all of the width of component 26.

The example of FIG. 8 in which strands 80C are soldered or otherwise electrically attached to pads 40 in grooves 50 is merely illustrative. If desired, strands 80C may be electrically coupled to pads 40 using interconnect structures that pass through protective structure 130. This type of example is illustrated in FIG. 9.

Figure 9:
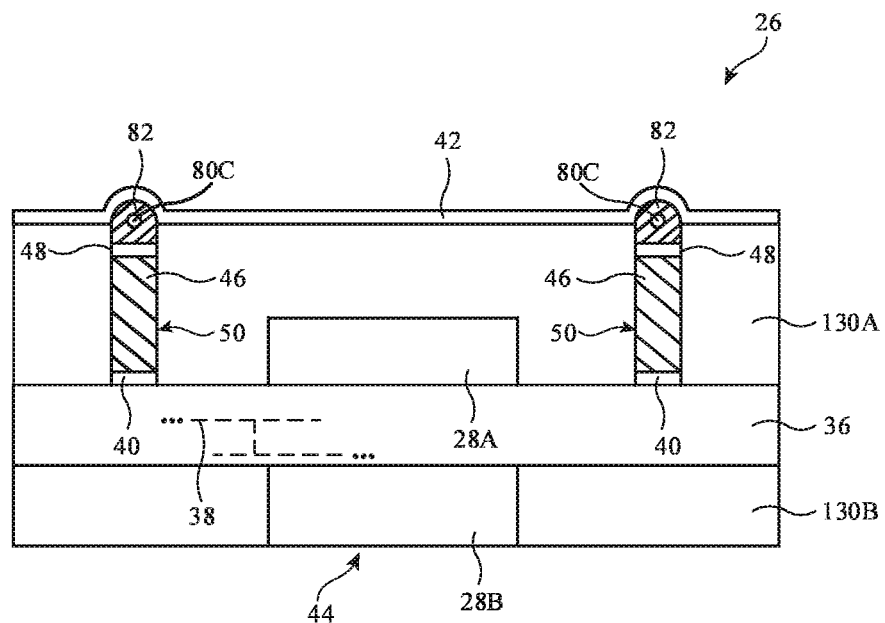
FIG. 9 is a cross-sectional side view of an illustrative electrical component coupled to conductive strands using interconnect structures that pass through a protective structure in accordance with an embodiment.

In the example of FIG. 9, electrical component 26 includes one or more devices such as devices 28A and 28B on interconnect substrate 36. Devices 28A and 28B may, if desired, be mounted to opposing sides of interconnect substrate 36. Device 28A may be encapsulated by a first protective structure 130A on a first side of substrate 36, and device 28B may be encapsulated by a second protective structure 130B on a second side of substrate 36.

Devices 28A and 28B may be the same type of device or may be different types of devices. If desired one or both of devices 28A and 28B may be an optical device (e.g., a light-emitting device, a light-sensing device, etc.). In arrangements where device 28A and/or device 28B is an optical device, protective structure 130A and/or transparent 130B may be configured to allow light to reach or be emitted from device 28A and/or 28B. For example, in arrangements where device 28B is an optical component, protective structure 130B may have an opening such as opening 44 through which light reaches and is sensed by device 28B and/or through which light is emitted from device 28B. In arrangements where device 28A is an optical component, protective structure 130A may be formed from a transparent material that allows light to reach and be sensed by device 28A and/or through which light is emitted from device 28A. This is, however, merely illustrative. If desired, devices 28A and 28B may be devices that do not detect or emit light.

As shown in FIG. 9, component 26 may include one or more interconnect structures such as interconnect structures 46 for coupling conductive strands 80C to pads 40. Interconnect structures 46 may have a first end that forms or is coupled to pad 48 and a second opposing end coupled to pad 40 on substrate 36. Conductive strands 80C may be coupled to pads 48 using solder or other conductive material 82. An encapsulation layer such as encapsulation film 42 (e.g., thermoplastic, epoxy, polyamide, polyurethane, silicone, other suitable materials, or a combination of any two or more of these materials) may cover the electrical connections between strands 80C and pads 48, if desired. With this type of configuration, electrical signals may be conveyed between strands 80C and device 28A and/or device 28B using vertical interconnect structures 46 that pass through protective structure 130A. If desired, one or more vertical interconnect structures may also or instead be formed in protective structure 130B. The example of FIG. 9 is merely illustrative.

In some arrangements, grooves 50 may be formed by removing material from protective structure 130A. In other arrangements, it may be desirable to mold protective structure 130A to include grooves 50 to eliminate the need for a subsequent groove-forming step. With this type of arrangement, interconnect structures 46 may be mounted to pads 40 on substrate 36 (e.g., using a pick-and-place machine or other suitable surface mount technology) before protective structure 130A is formed. After interconnect structures 46 have been mounted to pads 40 on substrate 36, protective structure 130A may be molded over substrate 36 and device 28A, leaving pads 48 at the upper surface of interconnect structures 46 exposed. Following molding of protective structure 130A, solder 82 (e.g., solder paste, pre-apply solder, or preform solder) may be deposited on pads 48. Conductive strands 80C may be placed on solder 82 (e.g., during interlacing operations as described in connection with FIG. 4) and solder 82 may be reflowed. Upon reflow of solder 82, conductive strands 80C may sink down into solder 82, thereby forming a robust electrical connection between strands 80C and component 26. Encapsulation film 42 may then be deposited or otherwise formed on protective structure 130A to encapsulate the solder connections between strands 80C and pads 48.

Interconnect structures 46 may include vertical conductive structures such as plated metal vias and/or metal-filled vias, may be formed from printed circuit layers (e.g., one or more dielectric layers with metal traces or other interconnects), may be formed from conductive epoxy (e.g., conductive adhesive), and/or may be formed from any other suitable conductive material.

Figure 10:
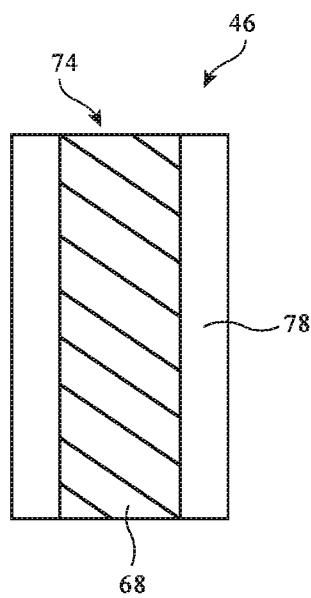
FIG. 10 is a cross-sectional side view of an illustrative interconnect structure such as a metal via in accordance with an embodiment.

For example, as shown in FIG. 10, interconnect structures 46 may include a conductive via such as metal via 68. Metal via 68 may include metal material located in a vertical opening such as opening 74 in dielectric material 78. Via 68 may be a metal-filled via in which metal 68 fills opening 74 or may be a metal-plated via in which metal 68 lines the walls of opening 74.

Figure 11:
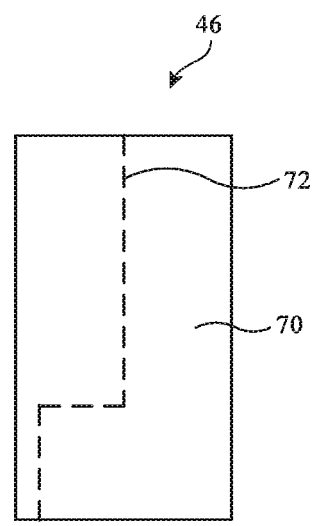
FIG. 11 is a cross-sectional side view of an illustrative interconnect structure formed from one or more printed circuit layers in accordance with an embodiment.

FIG. 11 shows an example in which interconnect structure 46 is formed from printed circuit layers. For example, interconnect structure 46 may include one or more printed circuit layers 70. Printed circuit layer(s) 70 may include flexible printed circuit layers such as polyimide layers, layers of rigid printed circuit board material such as fiberglass-filled epoxy (e.g., FR4), and/or other layers of polymer (or other dielectric). Metal traces 72 (e.g., interconnects) that are formed in printed circuit layers 70 may carry signals between the opposing upper and lower surfaces of interconnect substrate 46 (e.g., between pads 48 and 40 of FIG. 9). The examples of FIGS. 10 and 11 are merely illustrative, however. If desired, interconnect structures 46 may include any other suitable type of conductive pathway for conveying signals between pads 40 on substrate 36 and strands 80C (e.g., through protective structure 130A).

Figure 12:
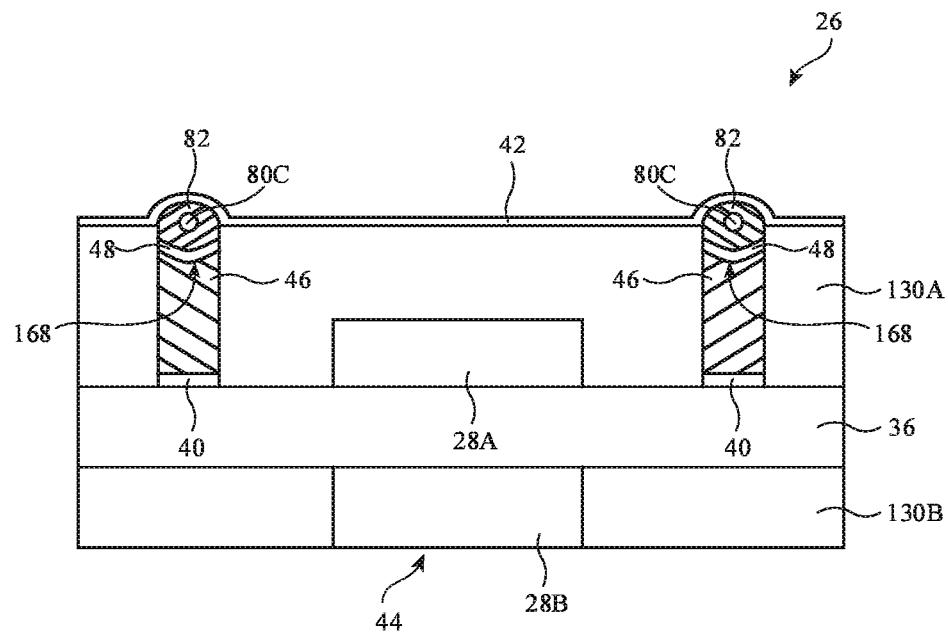
FIG. 12 is a cross-sectional side view of an illustrative electrical component coupled to conductive strands using interconnect structures with recessed surfaces in accordance with an embodiment.

If desired, the upper surface of interconnect structure 46 may be provided with a recess to help maintain strands 80C in place on pads 48. This type of arrangement is illustrated in FIG. 12. As shown in FIG. 12, the upper surface of interconnect structure 46 such as upper surface 168 may include a recess (e.g., a slot, groove, etc.) for receiving strands 80C. Upper surface 168 of interconnect structure 46 may be non-planar (as shown in the example of FIG. 12), or may be planar but include a recessed portion that helps maintain conductive strands in place on pads 48.

Figure 13:
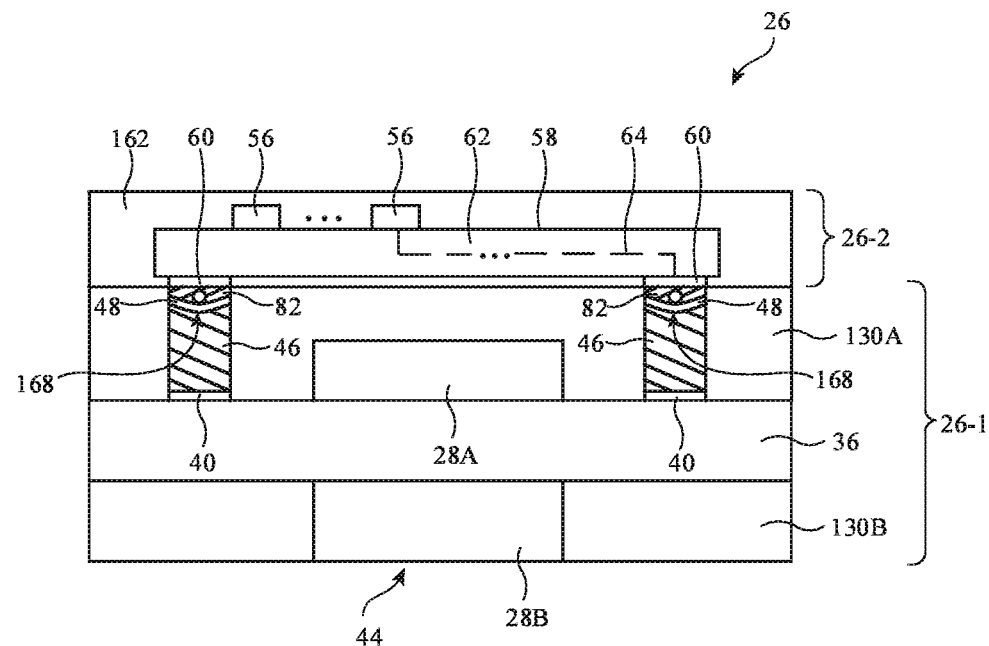
FIG. 13 is a cross-sectional side view of an illustrative electrical component coupled to conductive strands using interconnect structures and stacked with an additional electrical component in accordance with an embodiment.

If desired, additional components may be stacked on top of protective structure 130A. As shown in FIG. 13, for example, electrical component 26 may include stacked electrical components 26-1 and 26-2. Electrical component 26-1 may include devices 28A and 28B mounted to interconnect substrate 36 and covered with protective structures 130A and 130B, respectively. Interconnect structures 46 may be used to convey signals between conductive strands 80C at the top of protective structure 130A and substrate 36.

If desired, upper surface 168 of interconnect structures 46 may be recessed relative to the surrounding portions of protective structure 130A, thereby reducing the amount by which the solder connections between strands 80C and pads 48 protrude from the upper surface of protective structure 130A (e.g., providing a flat or nearly flat surface at the top of protective structure 130A). One or more additional components such as additional component 26-2 may be mounted to the upper surface of protective structure 130A (e.g., using a pick-and-place machine or other suitable surface mount technology).

Additional component 26-2 may include one or more electrical devices 56 on an interconnect substrate such as substrate 62. Devices 56 may include any suitable type of electrical device (e.g., any of the electrical devices described in connection with FIG. 5). Electrical component 26-2 may, for example, be an energy storage device (e.g., a battery) for storing power that may be provided to devices 28A and/or 28B, may include wireless charging circuitry (e.g., a coil and rectifier for receiving wirelessly transmitted power from a wireless power transmitting device that has a corresponding wireless power transmitting circuit with a coil) for receiving wireless power that may be provided to devices 28A and/or 28B, and/or may include other circuitry associated or not associated with the operation of devices 28A and 28B.

Metal traces 64 in substrate 62 may be used to convey electrical signals between devices 56 and electrical pads on the lower surface of substrate 62. An encapsulation structure such as encapsulant 162 may encapsulate component 26-2. Attachment structures such as attachment structure 60 may be used to couple component 26-1 to component 26-2. If desired, attachment structure 60 may be a conductive material such as solder or conductive adhesive and may electrically couple component 26-2 to strands 80C. In other arrangements, component 26-2 may be electrically insulated from strands 80C and coupled to other conductive structures in component 26 and/or item 10.

Figure 14:
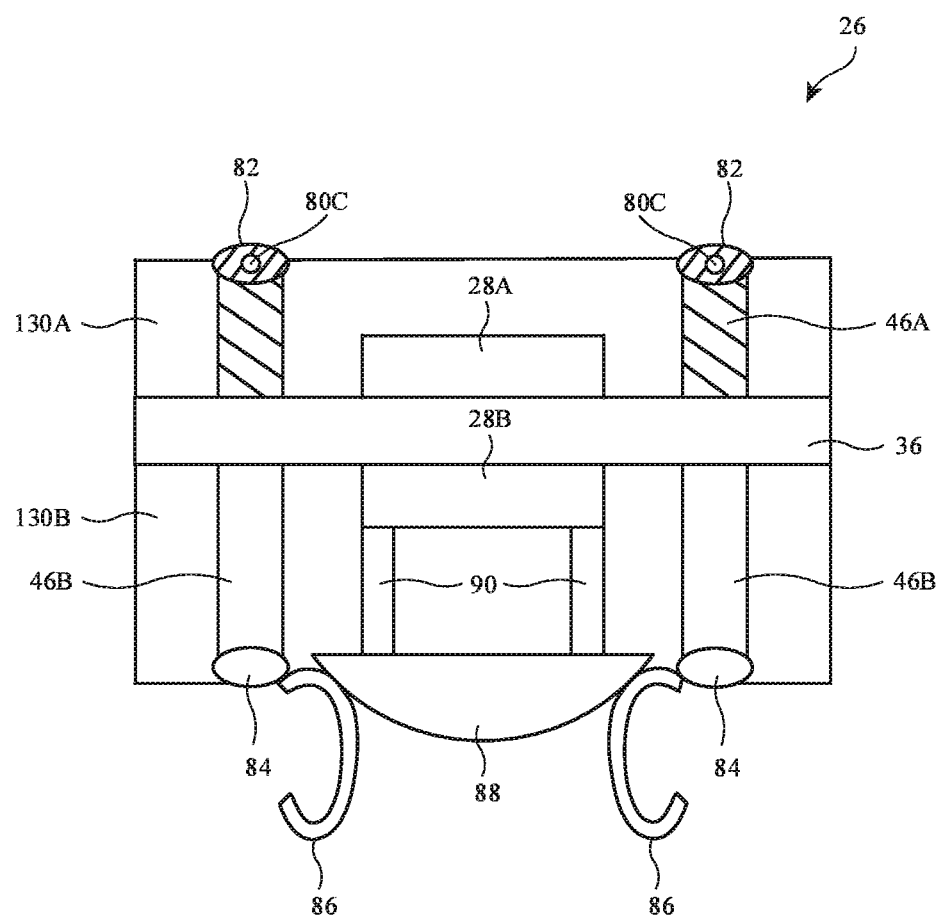
FIG. 14 is a cross-sectional side view of an illustrative electrical component coupled to conductive strands using interconnect structures and stacked with an optical component in accordance with an embodiment.

FIG. 14 shows an illustrative example in which device 28B is an optical component that receives or transmits light through a lens. As shown in FIG. 14, electrical component 26 may include devices 28A and 28B mounted to opposing sides of interconnect substrate 36 and covered with protective structures 130A and 130B, respectively. Conductive strands 80C may be soldered to the top of protective structure 130A and substrate 36. Interconnect structures 46A may be used to convey signals between conductive strands 80C and substrate 36.

Device 28B may be an optical component that emits and/or receives light through lens 88. Lens 88 may be mounted to device 28B using support structures 90. A reinforcement structure such as ring-shaped reinforcement structure 86 (e.g., a grommet or other ring-shaped reinforcement structure) may surround lens 88 and may be used to hold fabric 12 in place around lens 88.

If desired, interconnect structures 46B may pass through protective structure 130B to provide a signal path between substrate 36 and the lower surface of protective structure 130B. For example, additional conductive strands may be soldered to interconnect structures 46B using solder or other conductive material 84. This is, however, merely illustrative. If desired, interconnect structures 46B may be coupled to other conductive signal paths in item 10 or may be omitted.

Figure 15:
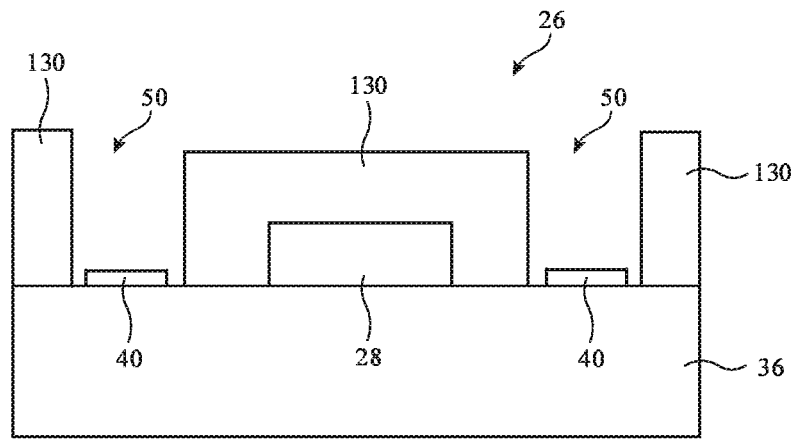
FIGS. 15, 16, and 17 are cross-sectional side views of an illustrative electrical component in which a protective structure is molded to include grooves for receiving conductive strands in accordance with an embodiment.
Figure 16:
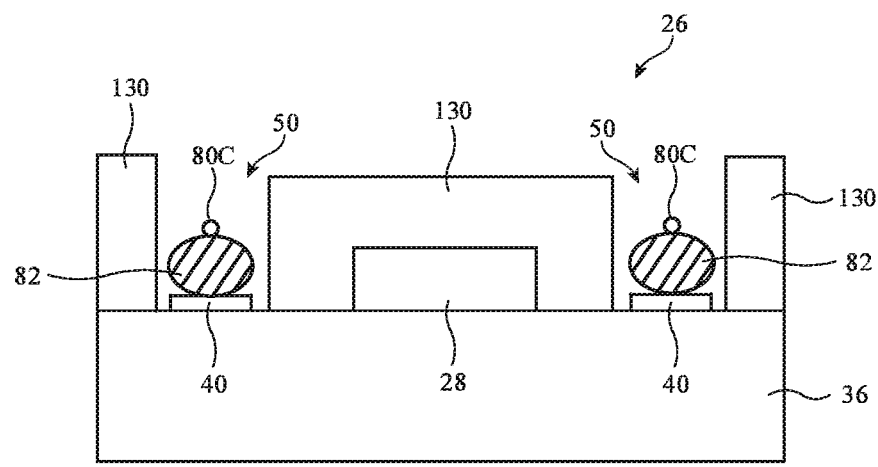
Figure 17:
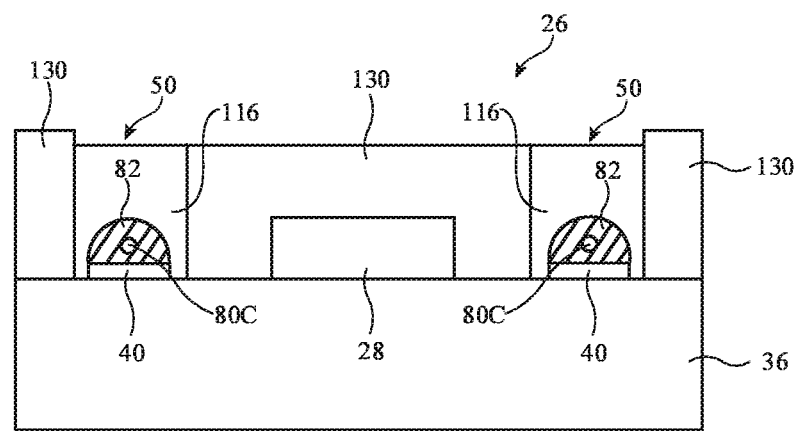

If desired, protective structure 130 may be molded using a molding tool that creates grooves in the protective structure so that a subsequent groove-forming step is not required. This type of example is illustrated in FIGS. 15, 16, and 17, which show component 26 at various stages of manufacturing. As shown in FIG. 15, protective structure 130 may be molded onto substrate 36. The molding tool used to form protective structure 130 may be configured to create grooves 50 in protective structure 130. When component 26 is removed from the molding tool, grooves 50 may leave pads 40 exposed.

After forming protective structure 130 on substrate 36, conductive strands 80C and solder 82 (e.g., solder paste, pre-apply solder, or preform solder) may be placed within grooves 50, as shown in FIG. 16. This may include, for example, dispensing solder 82 in grooves 50 and using insertion tool 54 (FIG. 4) to align conductive strands 80C within grooves 50 during interlacing operations.

After receiving solder 82 and strands 80C in grooves 50, a heating tool may be used to reflow solder 82, as shown in FIG. 17. During solder reflow operations, conductive strands 80C may sink down into conductive material 82. Following solder reflow, an encapsulant dispensing tool may be used to dispense encapsulant material 116 into grooves 50 to encapsulate the solder connection between strands 80C and substrate 36.

Figure 18:
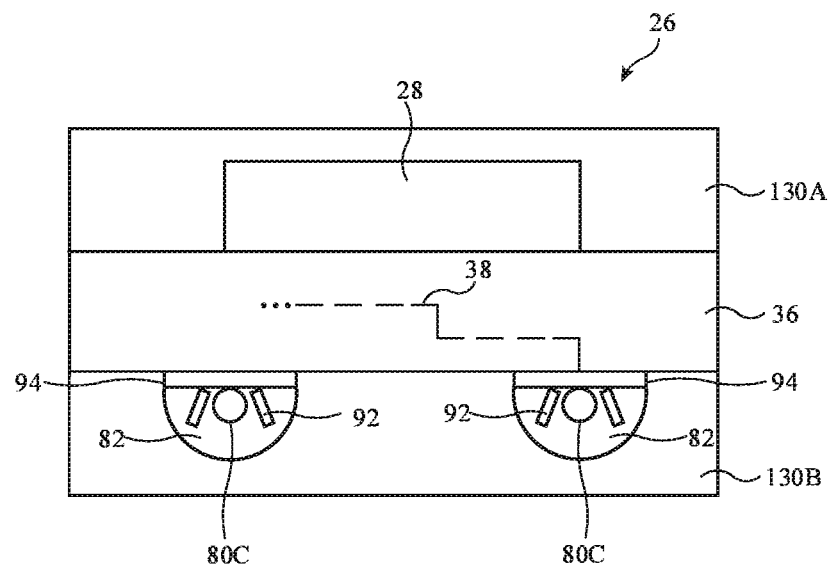
FIG. 18 is a cross-sectional side view of an illustrative electrical component having contact pads with strand-securing features in accordance with an embodiment.

FIG. 18 shows an illustrative example in which strands 80C are coupled to pads that are not located in grooves in a protective structure. Substrate 36 may have first and second opposing surfaces. One or more devices such as device 28 may be mounted to one or both surfaces of substrate 36. Pads 94 may be located on one or both sides of substrate 36. In the example of FIG. 18, device 28 is located on a first side of substrate 36 and pads 94 are located on a second opposing side of substrate 36. Device 28A may be covered with protective structure 130A. Strands 80C may be coupled to pads 94 using solder or other conductive material 82. After strands 80C are soldered or otherwise electrically coupled to pads 84, protective structure 130B may, if desired, be molded or otherwise formed over the solder connections between strands 80C and pads 94. To help secure strands 80C on pads 94 during solder reflow operations, a securing structure such as clamp 92 may be formed on pads 94. During interlacing operations, insertion tool 54 may be used to align component 26 with strands 80C such that strands 80C are received within clamps 92 on pads 94 before solder 82 is reflowed and protective structure 130B is formed.

Figure 19:
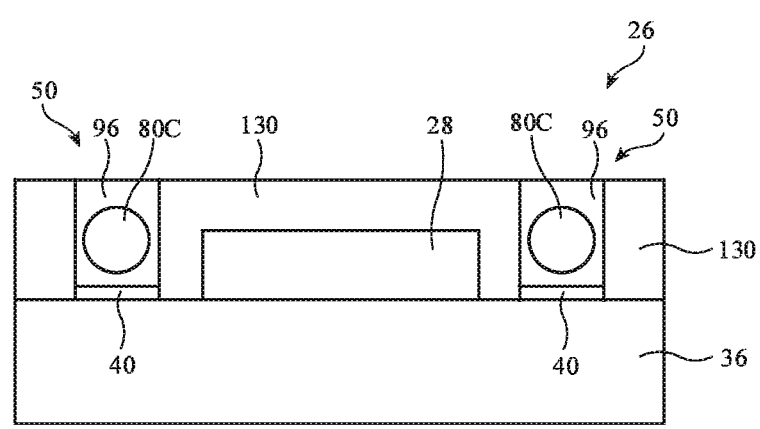
FIG. 19 is a cross-sectional side view of an illustrative electrical component coupled to conductive strands via a conductive material such as conductive epoxy in accordance with an embodiment.

FIG. 19 shows an illustrative example in which strands 80C are coupled to pads 40 using a conductive epoxy such as conductive epoxy 96 (e.g., a heat-cured conductive epoxy, ultraviolet-light-cured conductive epoxy, or other suitable conductive epoxy). Using a conductive epoxy may reduce the amount of surface area needed to create an electrical connection between strands 80C and pads 40. Before coupling strands 80C to pads 40, protective structure 130 may be molded or otherwise formed on surface 130. Grooves 50 may be formed my removing material from protective structure 130 after molding or may be formed by using a molding tool that creates grooves 50 in protective structure 130. After forming protective structure 130, insertion tool 54 may be used to align component 26 with strands 80C such that strands 80C are received within grooves 50. Conductive epoxy 96 may then be deposited in grooves 50 and cured (e.g., using heat, ultraviolet light, or other suitable curing method).

If desired, protective structure 130 may be molded around hollow structures to create grooves in the protective structure so that a subsequent groove-forming step is not required. This type of example is illustrated in FIGS. 20, 21, and 22, which show component 26 at various stages of manufacturing.

Figure 20:
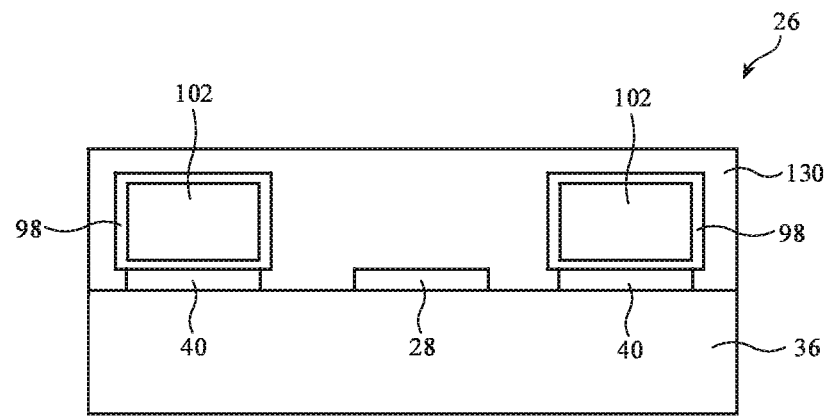
FIGS. 20, 21, and 22 are cross-sectional side views of an illustrative electrical component in which a protective structure is molded around hollow structures that create top-facing recesses for receiving conductive strands in accordance with an embodiment.

As shown in FIG. 20, device 28 may be mounted to interconnect substrate 36. One or more hollow structures such as hollow conductive structures 98 may be coupled to respective pads 40 on substrate 36 (e.g., using solder, conductive adhesive, or other conductive material and/or using other electrical connections such as a welds, crimped metal connections, etc.).

Hollow conductive structure 98 may be a metal box or other hollow structure having an interior cavity 102 (e.g., an air-filled cavity). Protective structure 130 may be molded or otherwise formed over substrate 36 around hollow conductive structures 98.

Figure 21:
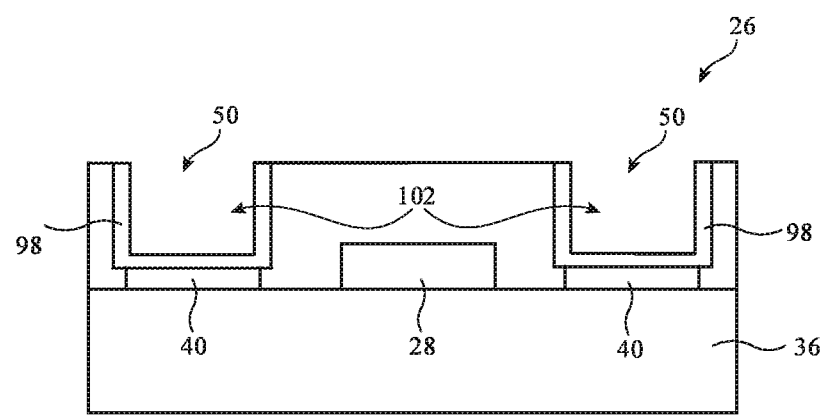
Figure 22:
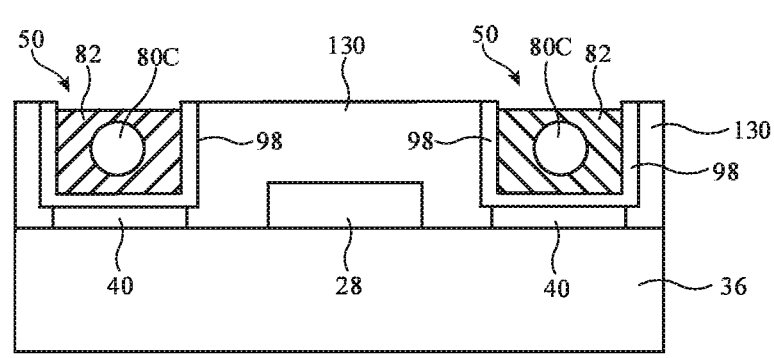

After forming protective structure 130 on substrate 36, top portions of protective structure 130 and hollow conductive structures 98 may be removed to expose cavities 102 and thereby form open grooves 50 in protective structure 130, as shown in FIG. 21. After removing the top portion of conductive structure 98, conductive structure 98 may have a U-shape with a first surface attached to pad 40 and first and second side wall surfaces that form a metal lining on groove 50. The side wall surfaces of conductive structure 98 may be perpendicular to the surface of substrate 36 on which pads 40 are formed. Portions of protective structure 130 and hollow conductive structures 98 may be removed from an upper portion of component 26 by machining, grinding, cutting, or other suitable technique.

After removing the upper portion of hollow conductive structures 98 to expose cavities 102, strands 80C may be inserted into cavities 102, as shown in FIG. 22. For example, insertion tool 54 may be used to align component 26 with strands 80C such that strands 80C are received within grooves 50 and cavities 102. Solder (or other conductive material) 82 may be deposited into cavities 102 and reflowed to form solder connections between each strand 80C and a respective one of conductive structures 98. This in turn electrically couples strands 80C to pads 40 through conductive structure 98.

If desired, grooves may be formed along one or more sides of component 26 instead of (or in addition to) grooves on the top or bottom surface of component 26. This type of example is illustrated in FIGS. 23 and 24, which show component 26 at various stages of manufacturing.

Figure 23:
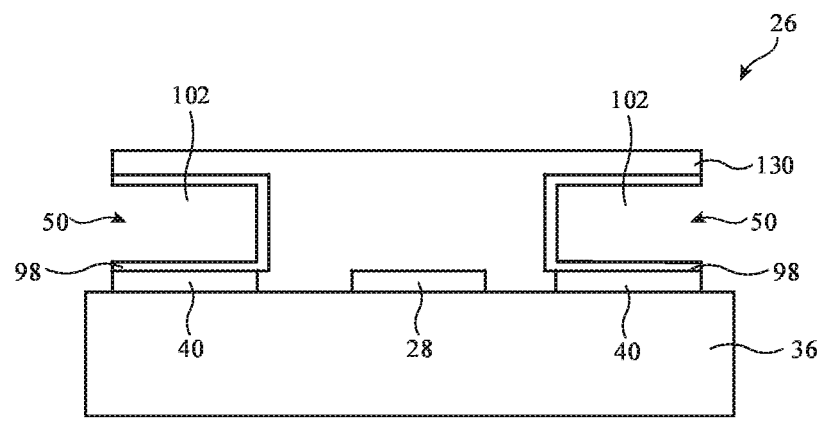
FIGS. 23, 24, and 25 are cross-sectional side views of an illustrative electrical component in which a protective structure is molded around hollow structures that create side-facing recesses for receiving conductive strands in accordance with an embodiment.

As shown in FIG. 23, device 28 may be mounted to interconnect substrate 36. One or more hollow structures such as hollow conductive structures 98 may be coupled to respective pads 40 on substrate 36 (e.g., using solder, conductive adhesive, or other conductive material and/or using other electrical connections such as a welds, crimped metal connections, etc.).

Hollow conductive structure 98 may be a metal box or other hollow structure having an interior cavity 102 (e.g., an air-filled cavity). Protective structure 130 may be molded or otherwise formed over substrate 36 around hollow conductive structures 98.

Figure 24:
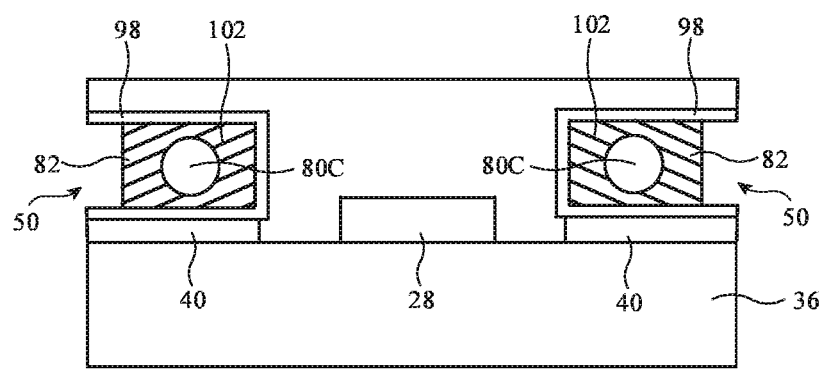

After forming protective structure 130 on substrate 36, side portions of protective structure 130 and hollow conductive structures 98 may be removed to expose cavities 102 and thereby form grooves 50 along the sides of protective structure 130, as shown in FIG. 24. After removing the side portions of conductive structure 98, conductive structure 98 may have a U-shape with a first surface attached to pad 40 and first and second side wall surfaces that form a metal lining on groove 50. The side wall surfaces of conductive structure 98 may be parallel to the surface of substrate 36 on which pads 40 are formed. Portions of protective structure 130 and hollow conductive structures 98 may be removed from the sides of component 26 by machining, grinding, cutting, or other suitable technique.

After removing the side portions of hollow conductive structures 98 to expose cavities 102, strands 80C may be inserted into cavities 102, as shown in FIG. 24. For example, insertion tool 54 may be used to align component 26 with strands 80C such that strands 80C are received within grooves 50 and cavities 102. Solder (or other conductive material) 82 may be deposited into cavities 102 and reflowed to form solder connections between each strand 80C and a respective one of conductive structures 98. This in turn electrically couples strands 80C to pads 40 through conductive structure 98.

Figure 25:
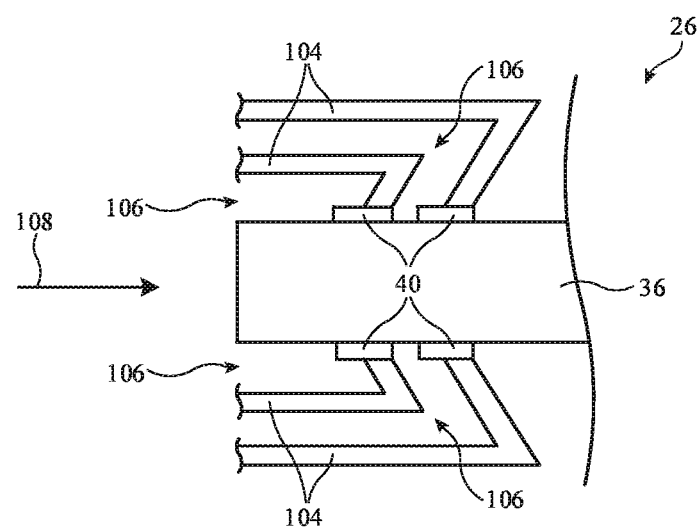

If desired, conductive structures may be used to form an electrical connector on component 26. This type of arrangement is illustrated in FIG. 25. As shown in FIG. 25, multiple conductive structures 104 may be respectively coupled to pads 40 on substrate 36. Conductive structures 104 may be metal structures separated from one another by gaps 106. Gaps 106 may form channels for receiving conductive strands. A mating connector with conductive strands may be inserted into channels 106 in direction 108. The conductive strands 80C may be guided within channels 106 towards pads 40.

If desired, component 26 may be embedded within printed circuit layers. This type of arrangement is illustrated in FIGS. 26, 27, 28, and 29, which show component 26 at various stages of manufacturing.

Figure 26:
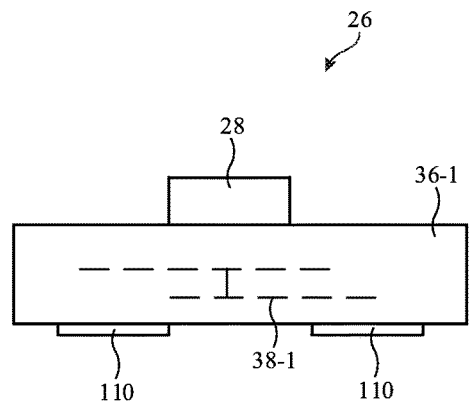
FIGS. 26, 27, 28, and 29 are cross-sectional side views of an illustrative electrical component an electrical device is embedded within printed circuit layers and coupled to conductive strands in accordance with an embodiment.

As shown in FIG. 26, one or more devices 28, if desired, may be mounted to an upper surface of interconnect substrate 36-1, which may include metal traces 38-1. Pads 110 may be formed on an opposing lower surface of substrate 36-1.

Figure 27:
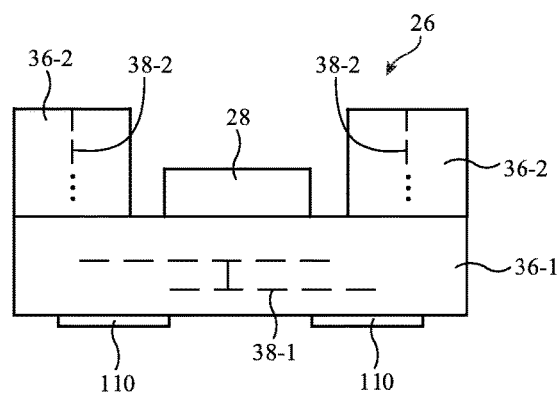

After mounting device 28 to substrate 36-1, additional printed circuit layers may be formed around device 28 on substrate 36-1, as shown in FIG. 27. Additional printed circuit layers 36-2 may include flexible printed circuit layers such as polyimide layers, one or more layers of rigid printed circuit board material such as fiberglass-filled epoxy (e.g., FR4), and/or layers of other materials (e.g., other dielectric materials such as silicone, other elastomeric material, other flexible polymers, etc.). Printed circuit layers 36-2 may include traces 38-2.

Figure 28:
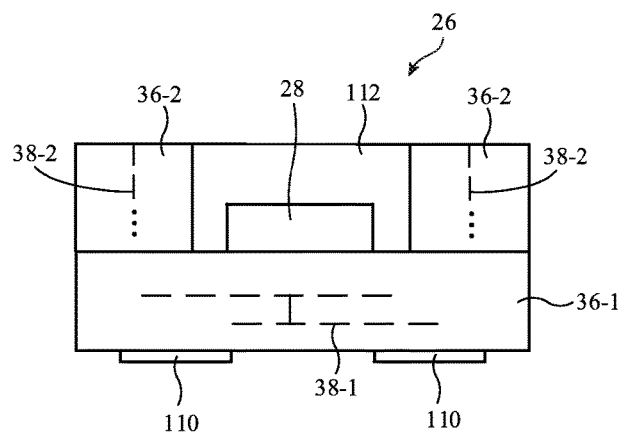

After forming printed circuit layers 36-2 around device 28 on the upper surface of substrate 36-1, device 28 may be encapsulated, as shown in FIG. 28. Encapsulant material 112 (e.g., thermoplastic, epoxy, polyamide, polyurethane, silicone, other suitable materials, or a combination of any two or more of these materials) may be formed over device 28 and may, if desired, fill the gap between printed circuit layers 36-2.

Figure 29:
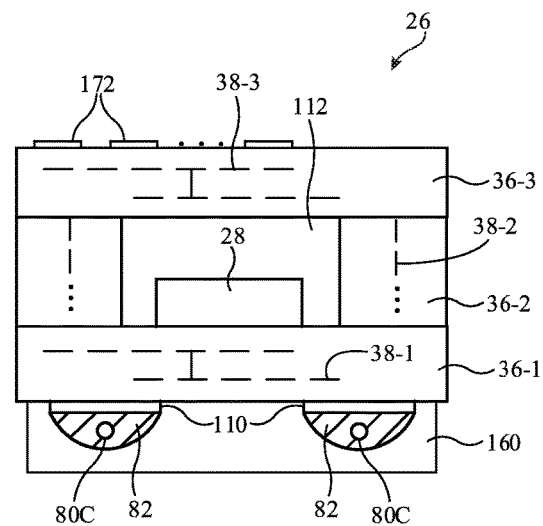

FIG. 29 shows how additional printed circuit layers 36-3 may be formed on top of printed circuit layers 36-2 and device 28. Printed circuit layers 36-3 may include flexible printed circuit layers such as polyimide layers, one or more layers of rigid printed circuit board material such as fiberglass-filled epoxy (e.g., FR4), and/or layers of other materials (e.g., other dielectric materials such as silicone, other elastomeric material, other flexible polymers, etc.). Printed circuit layers 36-3 may include traces 38-3. Signals may be conveyed between printed circuit layers 36-3 and 36-1 using traces 38-2 in printed circuit layers 36-2. If desired, additional pads 172 may be formed on the top surface of substrate 36-3. Additional components (e.g., additional components 26) may be mounted to pads 172, if desired.

Conductive strands 80C may be electrically coupled to pads 110 using solder or other conductive material 82. The solder connections between pads 110 and strands 80C may be encapsulated using encapsulation material 160 (e.g., thermoplastic, epoxy, polyamide, polyurethane, silicone, other suitable materials, or a combination of any two or more of these materials). Electrical signals may be conveyed between strands 80C and device 28 through pads 110 and traces 38-1 in substrate 36-1. If desired, electrical signals may be conveyed between strands 80C (and/or device 28) and any additional components mounted to pads 172 through traces 38-2 and 38-3.

It should be understood that any of the features described in connection with FIGS. 1-29 may be combined with one another in any suitable combination or fashion. For example, clamp 92 of FIG. 18 may be formed with the interconnect structure arrangement of FIG. 9; an additional stacked electrical component of the type shown in FIG. 13 may be combined with the molded groove component of FIG. 17; the optical component of FIG. 14 may include grooves formed using the process shown in FIGS. 20, 21, and 22, etc. Electrical connections to strands on one side of an electrical component may be formed using a different method or different features than electrical connections to strands on the opposite side of the electrical component. In general, components 26 may be attached to fabric 12 using any suitable combination of features described in connection with FIGS. 1-29.

As described above, one aspect of the present technology is the gathering and use of data available from specific and legitimate sources. The present disclosure contemplates that in some instances, this gathered data may include personal information data that uniquely identifies or can be used to identify a specific person. Such personal information data can include demographic data, location-based data, online identifiers, telephone numbers, email addresses, home addresses, data or records relating to a user's health or level of fitness (e.g., vital signs measurements, medication information, exercise information), date of birth, or any other personal information.

The present disclosure recognizes that the use of such personal information data, in the present technology, can be used to the benefit of users. For example, the personal information data can be used to deliver targeted content that may be of greater interest to the user in accordance with their preferences. Accordingly, use of such personal information data enables users to have greater control of the delivered content. Further, other uses for personal information data that benefit the user are also contemplated by the present disclosure. For instance, health and fitness data may be used, in accordance with the user's preferences to provide insights into their general wellness, or may be used as positive feedback to individuals using technology to pursue wellness goals.

The present disclosure contemplates that those entities responsible for the collection, analysis, disclosure, transfer, storage, or other use of such personal information data will comply with well-established privacy policies and/or privacy practices. In particular, such entities would be expected to implement and consistently apply privacy practices that are generally recognized as meeting or exceeding industry or governmental requirements for maintaining the privacy of users. Such information regarding the use of personal data should be prominent and easily accessible by users, and should be updated as the collection and/or use of data changes. Personal information from users should be collected for legitimate uses only. Further, such collection/sharing should occur only after receiving the consent of the users or other legitimate basis specified in applicable law. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations that may serve to impose a higher standard. For instance, in the US, collection of or access to certain health data may be governed by federal and/or state laws, such as the Health Insurance Portability and Accountability Act (HIPAA); whereas health data in other countries may be subject to other regulations and policies and should be handled accordingly.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, such as in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely block the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing identifiers, controlling the amount or specificity of data stored (e.g., collecting location data at city level rather than at an address level), controlling how data is stored (e.g., aggregating data across users), and/or other methods such as differential privacy.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users based on aggregated non-personal information data or a bare minimum amount of personal information, such as the content being handled only on the user's device or other non-personal information available to the content delivery services.

The foregoing is merely illustrative and various modifications can be made by those skilled in the art without departing from the scope and spirit of the described embodiments. The foregoing embodiments may be implemented individually or in any combination.

What is claimed is:

1. An item, comprising:
   strands that are interlaced to form fabric and that include a conductive strand; and
   an electrical component mounted to the fabric, wherein the electrical component comprises:
   a substrate having a contact pad;
   an electrical device mounted to the substrate;
   a protective structure that encapsulates the electrical device; and
   an interconnect structure that passes through the protective structure and that electrically couples the conductive strand to the contact pad on the substrate.

2. The item defined in claim 1 wherein the substrate comprises printed circuit layers.

3. The item defined in claim 1 wherein the interconnect structure has a recessed upper surface and wherein the conductive strand is soldered to the recessed upper surface.

4. The item defined in claim 1 wherein the protective structure is molded around the interconnect structure.

5. The item defined in claim 4 wherein the protective structure comprises thermoplastic.

6. The item defined in claim 4 wherein the electrical device comprises an optical device and the protective structure comprises an opening through which light is transmitted.

7. The item defined in claim 4 wherein the electrical device comprises an optical device and the protective structure comprises transparent plastic.

8. The item defined in claim 1 wherein the electrical device comprises an optical device overlapped by a lens, the electrical component further comprising a grommet surrounding the lens that secures the fabric relative to the lens.

9. The item defined in claim 1 wherein the interconnect structure is selected from the group consisting of: printed circuit layers and a metal via.

10. The item defined in claim 1 further comprising an additional electrical component stacked with the electrical component, wherein the protective structure is interposed between the electrical component and the additional electrical component.

11. An electronic component mounted to fabric having a conductive strand, the electronic component comprising:
    a printed circuit substrate having a surface with a contact pad;
    an electrical device mounted to the printed circuit substrate;
    a protective structure that encapsulates the electrical device, wherein the protective structure has an opening; and
    a conductive structure coupled to the contact pad and located in the opening, wherein the conductive strand is located at least partially in the opening and is electrically coupled to the contact pad through the conductive structure.

12. The electronic component defined in claim 11 wherein the conductive structure comprises a U-shaped metal structure coupled to the contact pad and having first and second side wall surfaces that line the opening and are perpendicular to the surface.

13. The electronic component defined in claim 11 wherein the conductive structure comprises a U-shaped metal structure coupled to the contact pad and having first and second side wall surfaces that line the opening and are parallel to the surface.

14. The electronic component defined in claim 11 further comprising solder that couples the conductive strand to the conductive structure.

15. The electronic component defined in claim 11 wherein the protective structure comprises thermoplastic.

16. An electronic component mounted to fabric having a conductive strand, the electronic component comprising:
    first printed circuit layers having opposing first and second surfaces and a contact pad, wherein the conductive strand is electrically coupled to the contact pad;

an electrical device mounted to the first surface;

second printed circuit layers located on the first surface that at least partially surround the electrical device; and third printed circuit layers located on the second printed circuit layers such that the electrical device and the conductive strand are interposed between the third printed circuit layers and the first printed circuit layers.

17. The electronic component defined in claim 16 further comprising encapsulant material that encapsulates the electrical device.

18. The electronic component defined in claim 16 wherein the third printed circuit layers include third and fourth opposing surfaces and wherein the third surface is attached to the second printed circuit layers and the fourth surface has an additional contact pad.

19. The electronic component defined in claim 17 wherein the electrical device is located in a gap in the second printed circuit layers and wherein the encapsulant material fills the gap.

20. The electronic component defined in claim 16 further comprising:

solder that forms a solder connection between the conductive strand and the contact pad; and encapsulant material that encapsulates the solder connection.

* * * * *